United States Patent
Huang et al.

(10) Patent No.: US 6,916,700 B1
(45) Date of Patent: Jul. 12, 2005

(54) MIXED-MODE PROCESS

(75) Inventors: Yao-Sheng Huang, Kaohsiung (TW); Hui-Lun Chen, Ilan (TW); Ming-Yi Lee, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/757,519

(22) Filed: Jan. 15, 2004

(51) Int. Cl.[7] .......................................... H01L 21/8242
(52) U.S. Cl. ...................................... 438/240; 438/680
(58) Field of Search ............................... 438/240, 197, 438/239, 680, 954, 721, 723, 724, 755, 756, 757

(56) References Cited

U.S. PATENT DOCUMENTS 5,618,749 A * 4/1997 Takahashi et al. ........... 438/384
5,792,681 A * 8/1998 Chang et al. ................ 438/210
5,918,119 A * 6/1999 Huang ......................... 438/238
6,323,079 B1 * 11/2001 Takeshita .................... 438/238
6,586,299 B1 * 7/2003 Tsai ............................. 438/238

* cited by examiner

Primary Examiner—David Nhu
(74) Attorney, Agent, or Firm—Birch, Stewart, Kolasch & Birch, LLP

(57) ABSTRACT

A mixed-mode process introduces a hard mask layer. Due to the introduced hard mask layer made of non-resist material formed over devices, performance of a formed capacitor is protected from effects of an implantation process such as source/drain implantation. A self-aligned silicide (salicide) process for a MOSFET transistor can also be performed. Thus, production efficiency and performance of an IC product formed by the mixed-mode process can be improved. Moreover, the number of required fabrication steps is reduced and cost savings can be realized.

22 Claims, 3 Drawing Sheets

MIXED-MODE PROCESS

BACKGROUND

The present invention relates to an integrated circuit (IC) process. More particularly, it relates to a mixed-mode process for IC fabrication.

With the increased complexity of semiconductor devices used in integrated circuits (ICs) has generated an increased demand for concurrent creation of active semiconductor devices such as field effect transistors (FETs) and capacitors that are in relatively close proximity to the active semiconductor devices. This mixing of active and passive devices is referred to as mixed-mode fabrication of semiconductor components.

Thus, the major classification of devices such as MOSFETs, capacitors and even conductive wires can be desirably and practically merged and manufactured on the same integrated circuit (IC) through a so-called mixed-mode fabrication process.

The mixed-mode process improves the production efficiency and performance of an IC product. Additionally, the number of required fabrication steps is reduced and cost savings can be realized by simultaneously forming different types of devices on the same IC.

In U.S. Pat. No. 5,918,119, Huang illustrates a mixed mode process for integrating MOSFET devices, comprising different gate insulator thicknesses, with a capacitor structure.

In addition, U.S. Pat. No. 6,586,299 to Tsai, teaches a mixed-mode process to simultaneously form a conductive wire, a MOS transistor and a capacitor structure with the least numbers of steps. However, neither of the referenced patents introduces the use of a hard mask layer during device formation and an additional photolithography step is necessary during the formation of the MOSFET device. Thus, a shortened mixed-mode process for IC manufacturing is required to improve the production efficiency.

SUMMARY

Accordingly, an object of the invention is to provide an improved mixed-mode process that can simultaneously form different types of devices on a semiconductor structure or a semiconductor structure fabrication with fewer steps.

Another object of the invention is to provide a mixed-mode process introducing the use of hard mask layer during device formations and the hard mask layer is left over the formed devices after the process of the invention.

Thus, a mixed-mode process introducing a hard mask layer in accordance with one embodiment of the invention comprises the steps of providing a semiconductor structure and sequentially forming a first conductive layer, a dielectric layer and a second conductive layer on the semiconductor structure. A first stacked structure is then formed in a portion of the second conductive layer and the dielectric layer to reveal the first conductive layer exposed by the first stacked structure. Next a mask layer is conformably deposited over the first conductive layer and. covers the first stacked structure thereon and the mask layer and the first conductive layer are further patterned to simultaneously form a capacitor and a second stacked structure on the semiconductor structure, wherein the capacitor comprises the first stacked structure, a patterned mask layer thereon and a patterned first conductive layer therebelow and the second stacked structure comprises a patterned first conductive layer and a patterned mask layer stacked thereabove. At this point, the second structure can perform as a conductive wire device.

Moreover, before forming the first conductive layer on the semiconductor structure, a step of selectively forming a gate dielectric layer on a portion of the semiconductor structure can be performed and thus during patterning the mask layer and the first conductive layer, the gate dielectric layer formed on the semiconductor structure can also be patterned to form a second stacked structure comprising a patterned first conductive layer, a patterned mask layer and a patterned gate dielectric layer stacked on the semiconductor structure.

Finally, through conventional source/drain implantation, source/drain regions are formed in the semiconductor structure on opposite sides of the second stacked structure and a spacer is then formed on sidewalls thereof. Thus, a silicide layer can be selectively formed on top of the source/drain regions to form a MOSFET device comprising the second stacked structure.

According to the described process, two different types of devices can be simultaneously formed on a semiconductor structure.

Nevertheless, a mixed-mode process introducing a hard mask layer in accordance with one embodiment of the invention further illustrates a process of simultaneously forming more than two types of devices on a semiconductor structure. This process includes the steps of providing a semiconductor structure having a capacitor region, a conductive region and a MOS region and a first conductive layer, a dielectric layer and a second conductive layer are sequentially formed thereon. Then a first stacked structure is formed in a portion of the second conductive layer and the dielectric layer within the capacitor region to reveal the first conductive layer exposed by the first stacked structure. Next, a mask layer is conformably deposited over the first conductive layer and covers the first stacked structure thereon. Next, a first pattern, a second pattern and a third pattern are respectively formed on the mask layer within the capacitor region, the conductive region and the MOS region. The first pattern covers the mask layer over the first stacked structure and the second pattern and the third pattern respectively cover other portions of the mask layer. Next, the mask layer and the first conductive layer are patterned to simultaneously form a capacitor, a second stacked structure and a third stacked structure on the semiconductor structure within the capacitor region, the conductive region and the MOS region. The capacitor comprises the first stacked structure, a patterned mask layer thereon and a patterned first conductive layer therebelow and the second stacked structure and the third stacked structure each comprises a patterned first conductive layer and a patterned mask layer thereabove. At this point, the second structure can perform as a conductive wire device.

Moreover, before forming the first conductive layer on the semiconductor structure, a step of selectively forming a gate dielectric layer on a portion of the semiconductor structure within the MOS region can be performed and thus during patterning the mask layer and the first conductive layer, the gate dielectric layer formed on the semiconductor structure within the MOS region can also be patterned to formed a third stacked structure comprising a patterned first conductive layer, a patterned mask layer and a patterned gate dielectric layer on the semiconductor structure.

Finally, through conventional source/drain implantation, source/drain regions are formed in the semiconductor structure on opposite sides of the third stacked structure and a spacer is then formed on sidewalls thereof. Thus, a silicide layer can be selectively formed on top of the source/drain regions to form a MOSFET device comprising the third stacked structure.

Due to the introduced hard mask layer in the mixed-mode process of the invention, the thickness of the capacitor dielectric layer of the capacitor and capacitance thereof can be accurately maintained. Moreover, the hard mask layer over each device provides protection against an implantation process such as source/drain implantation and ion breakthrough can be prevented. Thus, an additional photolithography step can be omitted.

In addition, the capacitor structure formed by the present invention can be simple and a self-aligned silicide (salicide) process for forming source/drain regions of a MOSFET transistor with reduced resistance can also be accomplished by the invention. Thus, the production efficiency and performance of an IC product formed by the mixed-mode process of the present invention can be improved such that the number of required fabrication steps and overall cost can be reduced. Thus, the production efficiency and performance of an IC product formed by the mixed-mode process of the present invention can be improved such that the number of required fabrication steps and overall cost can be reduced Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can be more fully understood by reading the subsequent detailed description and examples with references made to the accompanying drawings, which are given by way of illustration only, and thus are not limitative of the present invention, and wherein.

DESCRIPTION

Figure 1:
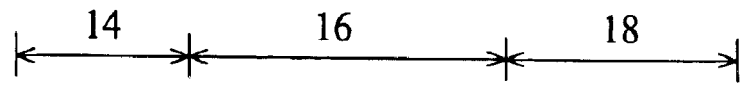
FIG. 1 is a schematic diagram showing a semiconductor structure with an isolation structure.
Figure 1:
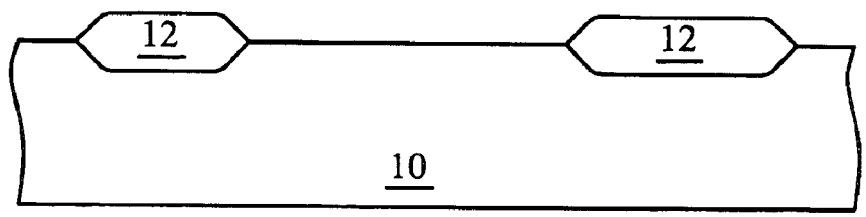

FIGS. 1 to 6 sequentially demonstrate a mixed-mode process in accordance with one embodiment of the present invention. In FIG. 1, a semiconductor structure 10, for example a silicon substrate, has at least a conductive region 14, a metal-oxide semiconductor (MOS) transistor region 16 and a capacitor region 18 thereon. The semiconductor structure 10 should be understood to possibly further include conductive and/or insulating layers formed over such substrate or wafer, and active and/or passive devices formed over or on such a substrate or wafer.

An isolation structure 12, for example a field oxide (FOX) structure, is formed on portions of the semiconductor structure 10 within either the conductive region 14 or the capacitor region 18. The isolation structure 12 can also be a shallow trench isolation (STI) structure formed by the well-known STI technique.

Figure 2:
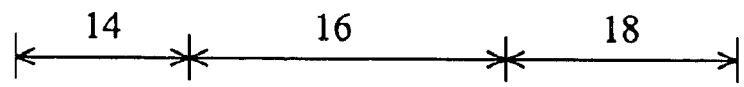
FIG. 2 is a schematic diagram showing the structure of FIG. 1 with added layers.
Figure 2:
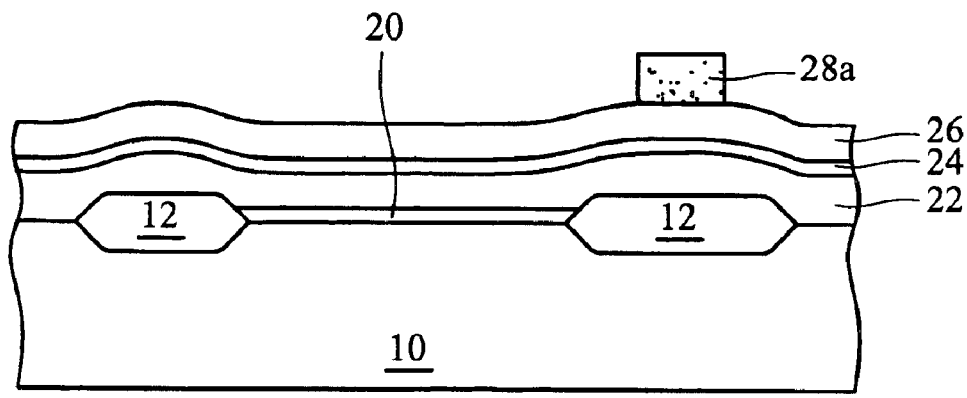

In FIG. 2, a gate dielectric layer 20 is selectively formed on the semiconductor structure 10 within the MOS transistor region 16. Then a first conductive layer 22, a dielectric layer 24 and a second conductive layer 26 are sequentially formed over the semiconductor structure 10. Next, a first pattern 28a, covering a portion of the second conductive layer 26 within the capacitor region 18, is formed on the second conductive layer 26 through a photolithography step (not shown) for defining a layer of photoresist (PR) material, for example, deposited on the semiconductor structure 10. The gate dielectric layer 20 can be a dielectric material such as thermally formed oxide or the novel high-K material having a high dielectric constant (normally with K above 5) such as $HfO_2$, $ZrO_2$, $TiO_2$, $Al_2O_3$ or $Ta_2O_5$. In addition, the first and second conductive layers 22 and 26 can be polysilicon and the material of the dielectric layer 24 therebetween can be silicon oxide, silicon nitride, silicon oxynitride or the described high-K materials formed by chemical vapor deposition (CVD) or sputtering. The thickness of the dielectric layer 24 is about 60 Å to 500 Å and the thickness of the first and second conductive layer are about 1500 Å to 3000 Å and 1500 Å to 3000 Å, respectively.

Figure 3:
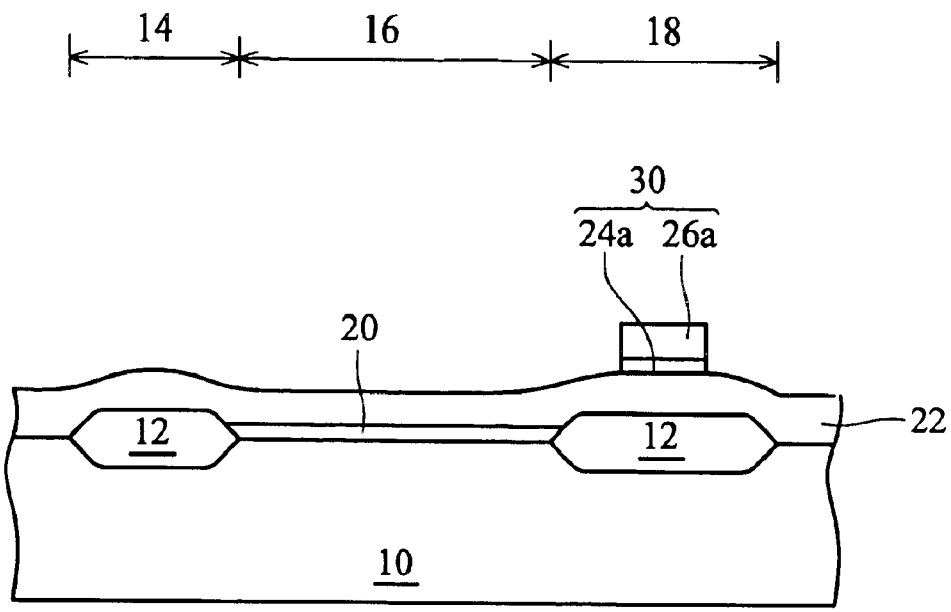
FIG. 3 is a schematic diagram showing the structure of FIG. 2 after an etching step with a first stacked structure.

In FIG. 3, an etching step (not shown) is then performed, using the first pattern 28a within the capacitor region 18 as an etching mask, to pattern the second conductive layer 26 and the dielectric layer 24 exposed by the first pattern 28a and stops on the first conductive layer 22. After the etching step, the first pattern 28a is removed and a first stacked structure 30 comprising a patterned dielectric layer 24a and a patterned second conductive layer 26a is thus formed on the first conductive layer 22 within the capacitor region 18.

Figure 4:
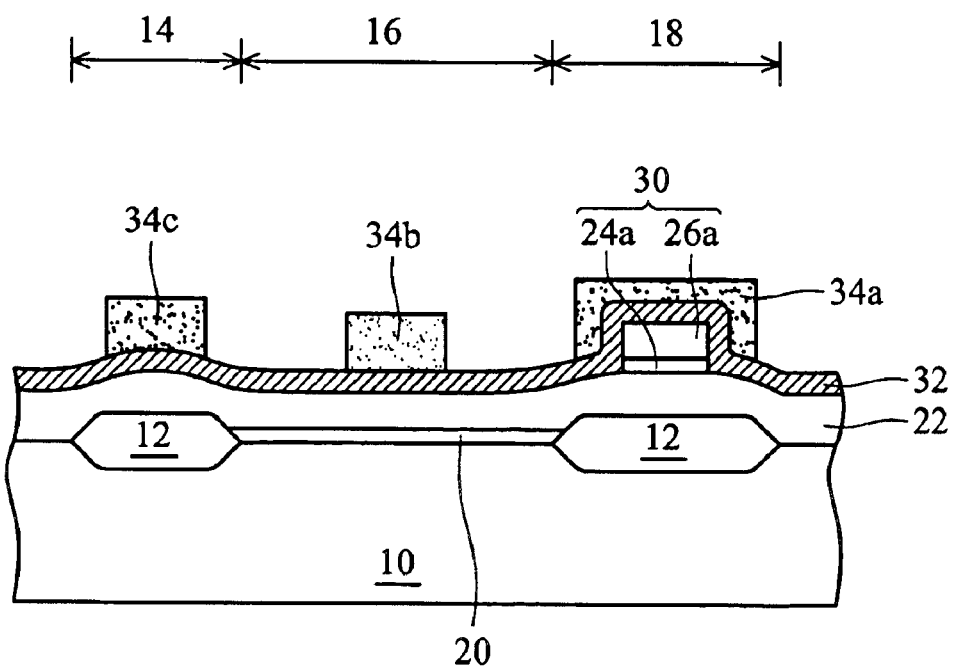
FIG. 4 is a schematic diagram showing the structure of FIG. 3 with a hard mask layer and additional patterns.

In FIG. 4, a hard mask layer 32 is conformably deposited on the first conductive layer 22 and covers the first stacked structure 30 thereon. The hard mask layer material can be silicon nitride or conventional insulating material which is different from the first conductive layer 22. The thickness of the hard mask layer is about 1000 Å to 3000 Å. A second pattern 34a, a third pattern 34b and a fourth pattern 34c are then formed on the mask layer 32, respectively covering a portion of the mask layer 32 within the conductive region 14, the MOS transistor region 16 and the capacitor region 18 through another photolithography step (not shown) of defining a layer of photoresist (PR) material, for example, deposited over the hard mask layer 32 and the first stacked structure 30 thereon.

Figure 5:
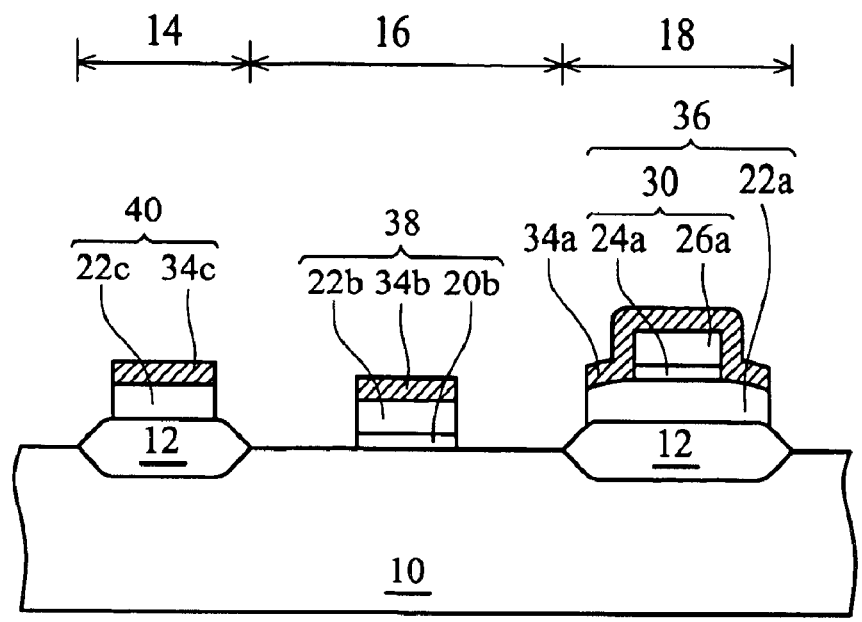
FIG. 5 is a schematic diagram showing the structure of FIG. 4 after another etching step.

In FIG. 5, another etching step (not shown) is then performed and the second, third and fourth patterns 34a, 34b and 34c respectively within the capacitor region 18, the MOS transistor region 16 and the conductive region 14 are used as an etching mask to pattern the hard mask layer 34 and the first conductive layer 22 exposed by the patterns 34a, 34b and 34c until the underlying structure, for example the semiconductor structure 10 or the isolation structure 12 are exposed. After the etching step, the patterns 34a, 34b and 34c are removed and a first device 36 comprising the first stacked structure 30 covered by a patterned hard mask layer 34a over a patterned first conductive layer 22a within the capacitor region 18, a second stacked structure 38 including a patterned gate dielectric layer 20b, first conductive layer 22b and hard mask layer 34b within the MOS transistor region 16 and a second device 40 including a patterned first conductive layer 22c within the conductive region 14 and a patterned hard mask layer 34c stacked thereon.

Figure 6:
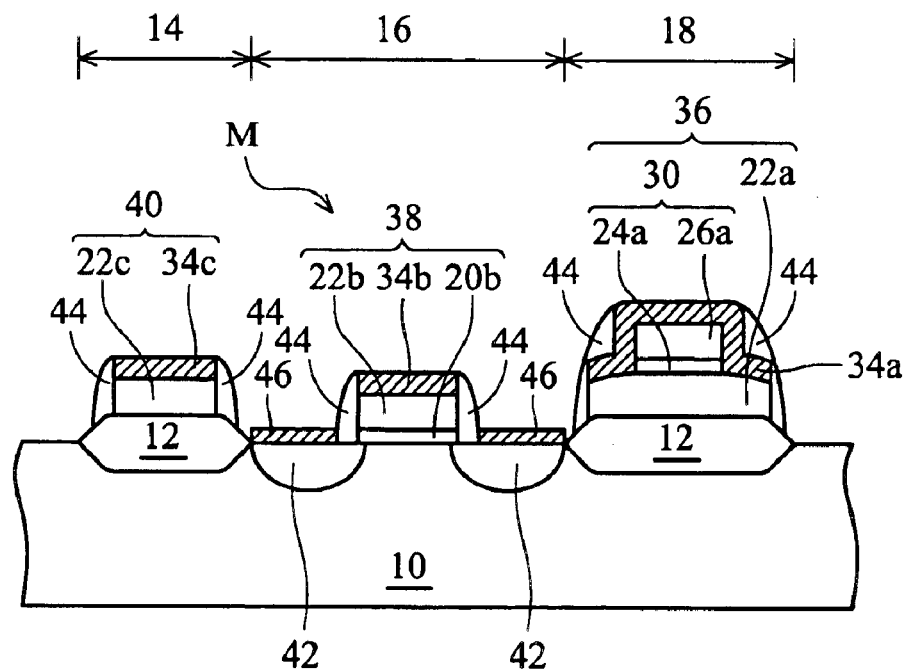
FIG. 6 is a schematic diagram showing the structure of FIG. 5 after an ion implantation process and the addition of a spacer and a silicide layer.

In FIG. 6, an ion implantation process (not shown) is performed to form source/drain regions 42 in the semiconductor structure 10 adjacent to either sides of the second stacked structure 38. A spacer 44 of insulating material such as silicon nitride is then formed on sidewalls of the first device 36, the second device 40 and the second stacked structure 38. Next, a self-aligned silicide (salicide) process (not shown) is performed to form a silicide layer 46 on the top of the source/drain regions 42 within the MOS region 16 and a MOSFET device M is thus formed therein as the third device on the semiconductor structure 10.

In FIG. 6, the patterned first conductive layer 22a, dielectric layer 24a and the first conductive layer 26a respectively functions as the lower electrode, the capacitor dielectric layer, and the upper electrode of a capacitor of the first device 36. The patterned mask layer 34a overlying the first device 36 protects the structure therein from the implantation during formation of the source/drain regions 42. In addition, a conductive wire comprises the patterned first conductive layer 22c covered by the patterned mask layer 34c thereon, referring to the second device 40, can be also protected form any effect of the formation of the source/drain regions 42. Moreover, the devices such as the second device 40 formed over the isolation structure 12, act as a conductive wire, and the first device 36, acting as a capacitor can be optionally formed over the semiconductor structure 10 other than the isolation structures 12 thereon.

Applications for simultaneously forming more than two different types of devices on a semiconductor structure are shown and can be further modified by those skilled in the art based on the mixed-process of the invention illustrated in FIG. 1 to FIG. 6 or modification thereof and are not restricted by the described mixed-mode process in the embodiment of the invention.

In comparison with U.S. Pat. Nos. 5,918,119 and 6,586,229, the present invention provides a mixed-mode process which introduces a hard mask layer to simultaneously form different types of devices on a semiconductor structure.

Due to the fact that the introduced hard mask layer is formed over the devices and is made of non-resist material, the mixed-mode process of the invention ensures that the thickness of the capacitor dielectric layer of the capacitor and capacitance thereof can be appropriately maintained. Moreover, the hard mask layer over each device provides protection against an implantation process such as source/drain implantation. Thus, ion breakthrough resulting from a conventional resist formed pattern can be prevented and an additional photolithography step can be eliminated.

In addition, the capacitor structure can be simply formed by the mixed-mode process of the present invention rather than by the complicated process illustrated in U.S. Pat. No. 6,586,229. A self-aligned silicide (salicide) process for forming source/drain regions of a MOSFET transistor with reduced-resistance can also be accomplished by the invention. In conclusion, the production efficiency and performance of an IC product formed by the mixed-mode process of the present invention is improved. Moreover, the number of required fabrication steps is reduced and cost savings can be realized.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mixed-mode process introducing a hard mask layer, comprising the steps of:
   providing a semiconductor structure;
   sequentially forming a first conductive layer, a dielectric layer, and a second conductive layer on the semiconductor structure;
   forming a first stacked structure in a portion of the second conductive layer and the dielectric layer, and revealing the first conductive layer exposed by the first stacked structure;
   conformably depositing a mask layer over the first conductive layer and covering the first stacked structure thereon; and
   patterning the mask layer and the first conductive layer to simultaneously form a capacitor and a second stacked structure on the semiconductor structure, wherein the capacitor comprises the first stacked structure, a patterned mask layer thereon and a patterned first conductive layer therebelow and the second stacked structure comprises a patterned first conductive layer and a patterned mask layer stacked thereabove.

2. The process as claimed in claim 1, wherein the patterned mask layer covers sidewalls of the first stacked structure.

3. The process as claimed in claim 1, wherein the first conductive layer and the second conductive layer are polysilicon.

4. The process as claimed in claim 1, wherein the dielectric layer is silicon dioxide, silicon nitride, silicon oxynitride or a high-K material.

5. The process as claimed in claim 4, wherein the high-K material is $HfO_2$, $ZrO_2$, $TiO_2$, $Al_2O_3$, or $Ta_2O_5$.

6. The process as claimed in claim 1, wherein the second stacked structure is a conductive wire device.

7. The process as claimed in claim 1, wherein the mask layer is made of non-resist materials different from a material of the first conductive layer.

8. The process as claimed in claim 7, wherein the mask layer is silicon nitride, silicon dioxide or silicon oxynitride.

9. The process as claimed in claim 1, further comprising the step of selectively forming a gate dielectric layer on a portion of the semiconductor structure before forming the first conductive layer on the semiconductor structure.

10. The process as claimed in claim 9, further comprising the step of patterning the gate dielectric layer formed on the semiconductor structure during patterning of the mask layer and the first conductive layer to thereby form a second stacked structure, the second stacked structure having a patterned first conductive layer, a patterned mask layer and a patterned gate dielectric layer stacked on the semiconductor structure.

11. The process as claimed in claim 10, wherein after the capacitor and the second stacked structure are formed on the semiconductor structure, the method further comprises steps of:
   forming source/drain regions in the semiconductor structure on opposite sides of the second stacked structure;
   forming a spacer on sidewalls of the second stacked structure; and
   selectively forming a silicide layer on top of the source/drain regions to form a MOSFET device comprising the second stacked structure on the semiconductor structure.

12. A mixed-mode process introducing a hard mask layer, comprising the steps of:
- providing a semiconductor structure having a conductive region, a metal-oxide semiconductor (MOS) region and a capacitor region;
- sequentially forming a first conductive layer, a dielectric layer, and a second conductive layer on the semiconductor structure;
- forming a first stacked structure in a portion of the second conductive layer and the dielectric layer within the capacitor region, and revealing the first conductive layer exposed by the first stacked structure;
- conformably depositing a mask layer over the first conductive layer and covering the first stacked structure thereon;
- respectively forming a first pattern, a second pattern and a third pattern on the mask layer within the capacitor region, the conductive region and the MOS region, wherein the first pattern covers the mask layer over the first stacked structure and wherein the second pattern and the third pattern respectively covers other portion of the mask layer; and
- patterning the mask layer and the first conductive layer to simultaneously form a capacitor, a second stacked structure and a third stacked structure on the semiconductor structure respectively within the capacitor region, the conductive region and the MOS region, wherein the capacitor comprises the first stacked structure, a patterned mask layer thereon and a patterned first conductive layer therebelow and the second stacked structure and the third stacked structure each comprises a patterned first conductive layer and a patterned mask layer thereabove.

13. The process as claimed in claim 12, wherein the patterned mask layer covers sidewalls of the first stacked structure.

14. The process as claimed in claim 12, wherein the first conductive layer and the second conductive layer are polysilicon.

15. The process as claimed in claim 12, wherein the dielectric layer is silicon dioxide, silicon nitride, silicon oxynitride or a high-K material.

16. The process as claimed in claim 15, wherein the high-K material is $HfO_2$, $ZrO_2$, $TiO_2$, $Al_2O_3$, or $Ta_2O_5$.

17. The process as claimed in claim 12, wherein the second stacked structure is a conductive wire device.

18. The process as claimed in claim 12, wherein the mask layer is a non-resist material different from a material of the first conductive layer.

19. The process as claimed in claim 18, wherein the mask layer is silicon nitride, silicon dioxide or silicon oxynitride.

20. The process as claimed in claim 12, further comprising the step of selectively forming a gate dielectric layer on a portion of the semiconductor structure within the MOS region before forming the first conductive layer on the semiconductor structure.

21. The process as claimed in claim 20, further comprising the step of patterning the gate dielectric layer formed on the semiconductor structure within the MOS region during patterning of the mask layer and the first conductive layer to thereby form a third stacked structure comprising a patterned first conductive layer, a patterned mask layer and a patterned gate dielectric layer stacked on the semiconductor structure.

22. The process as claimed in claim 21, wherein after the capacitor, the second stacked structure and the third stacked structure are formed on the semiconductor structure, the method further comprises the steps of:
- forming source/drain regions in the semiconductor structure on opposite sides of the third stacked structure within the MOS region;
- forming a spacer on sidewalls of the third stacked structure; and
- selectively forming a silicide layer on top of the source/drain regions to form a MOSFET device comprising the third stacked structure on the semiconductor structure.

* * * * *